(12) United States Patent
Kohli et al.

(10) Patent No.: US 8,913,457 B2
(45) Date of Patent: *Dec. 16, 2014

(54) DUAL CLOCK EDGE TRIGGERED MEMORY

(71) Applicants: STMicroelectronics International N.V., Amsterdam (NL); STMicroelectronics, SA, Montrouge (FR)

(72) Inventors: Nishu Kohli, Noida (IN); Robin M. Wilson, Saint Martin d'Uriage (FR)

(73) Assignees: STMicroelectronics International N.V., Amsterdam (NL); STMicroelectronics SA, Montrouge (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/271,165

(22) Filed: May 6, 2014

(65) Prior Publication Data

US 2014/0241102 A1 Aug. 28, 2014

Related U.S. Application Data

(63) Continuation of application No. 13/312,679, filed on Dec. 6, 2011, now Pat. No. 8,730,756.

(51) Int. Cl.
*G11C 8/00* (2006.01)
*G11C 8/18* (2006.01)

(52) U.S. Cl.
CPC .................................. *G11C 8/18* (2013.01)
USPC ................... 365/233.1; 365/191; 365/233.11; 365/233.12

(58) Field of Classification Search
USPC .................... 365/233.1, 233.11, 233.12, 191
See application file for complete search history.

(56) References Cited

U.S. PATENT DOCUMENTS

| | | | | |
|---|---|---|---|---|
| 5,530,677 A | * | 6/1996 | Grover et al. | 365/233.12 |
| 5,978,281 A | * | 11/1999 | Anand et al. | 365/189.05 |
| 6,987,699 B2 | * | 1/2006 | Lee | 365/194 |
| 7,583,551 B2 | * | 9/2009 | Klein | 365/222 |
| 7,936,637 B2 | * | 5/2011 | Shori | 365/233.1 |
| 8,665,664 B2 | | 3/2014 | Moon et al. | |
| 8,730,756 B2 | * | 5/2014 | Kohli et al. | 365/233.1 |

* cited by examiner

*Primary Examiner* — Pho M Luu
(74) *Attorney, Agent, or Firm* — Allen, Dyer, Doppelt, Milbrath & Gilchrist, P.A.

(57) ABSTRACT

Memory circuitry includes memory components operable in response to first edges of an internal clock. The memory circuitry also includes internal clock generating circuitry to generate the internal clock in response to a system clock. The first edges of the internal clock are generated in response to both a rising and a falling edge of the system clock.

26 Claims, 8 Drawing Sheets

DUAL CLOCK EDGE TRIGGERED MEMORY

RELATED APPLICATION

The present application is a continuation of and claims the benefit U.S. patent application Ser. No. 13/312,679, filed Dec. 6, 2011, now U.S. Pat. No. 8,730,756, issued May 20, 2014, and is incorporated herein by reference in its entirety for all purposes as if fully set forth herein.

FIELD OF INVENTION

The present invention relates to dual clock edge triggered components, and, more particularly, to a synchronous self-timed memory which is dual clock edge triggered.

BACKGROUND OF INVENTION

Single clock edge triggered synchronous integrated circuits are circuits in which sequential elements in the integrated circuit operate at either the rising or falling edge of the clock. The edge on which the sequential elements operate is known as the operable edge. For example, the elements may carry out an operation on a rising edge of a clock while the falling edge of the clock resets the clock signal so that another rising edge can occur. The sequential elements may be elements such as flip-flops and/or memories.

Propagation of each clock edge through a clock tree dissipates power. The power dissipation may be due to, for example, the switching of logic devices and corresponding capacitance. In some single clock edge triggered systems, the power consumed per operation may include the power dissipated by the propagation of the rising clock edge and the power dissipated by the propagation of the falling clock edge.

Dual edge clocked systems may provide power per operation savings. Memories for such a system have been suggested with an inclusion of an external edge detector on the system clock path. Alternatively, a memory for a dual edge clocked system may be triggered by a rising or falling edge (as required) of a dedicated memory clock signal generated from the system clock at double the system clock frequency. However, the introduction of external edge detectors adds a power and performance penalty, partly nullifying the power gained by virtue of dual edge operation, while the implementation of two clock trees may be complex because of requirement to balance two different clock trees.

SUMMARY OF THE INVENTION

According to a first aspect, there may be provided a memory circuitry comprising: memory components operable in response to first edges of an internal clock; and an internal clock generating circuitry configured to generate the internal clock in response to a system clock, wherein the first edges of the internal clock are generated in response to both a rising and a falling edge of the system clock.

The first edges may be one of rising edges and falling edges. The internal clock generating circuitry may comprise pulse generation circuit configured to generate a pulse in response to an edge of the system clock. The internal clock generating circuit may be additionally configured to generate the first clock edges in response to the pulse using an edge detection circuit. The internal clock circuitry may further comprise a hold circuit configured to receive and hold the output of the edge detection circuit to the value to which the first clock edge transitions in response to the pulse generated by pulse generation circuit. The hold circuit may be configured to hold a value of the internal clock until receipt of a reset signal.

The memory may further comprise a self-time circuitry, wherein the self-time circuitry is configured to generate the reset signal, which may be a pulse. Read and write operations of the memory may be triggered at the first edges. Reset events of the memory may be timed according to the self-timing circuitry. The reset events may be at least one of a sense amplifier enable, a bit line pre-charge on, word line off, and a clock generator reset, and may be triggered by the reset signal pulse. The edge detector may further comprise an enable input configured to receive an enable signal. The memory may be a synchronous self-timed memory.

According to a second aspect, there is provided a system comprising at least one dual edge triggered synchronous component and memory circuitry comprising memory components operable in response to first edges of an internal clock; and an internal clock generating circuitry configured to generate the internal clock in response to a system clock, wherein the first edges of the internal clock are generated in response to both a rising and a falling edge of the system clock.

The at least one dual edge triggered synchronous component may be a flip-flop. There may be at least one combinational logic component.

According to a third aspect, there may be provided a memory means comprising functional means for carrying out a memory function in response to first edges of an internal clock; and clock generating means for generating the internal clock in response to a system clock, wherein the first edges of the internal clock are generated in response to both a rising and a falling edge of the system clock.

The clock generating means may comprise pulse generation means for generating a pulse in response to an edge of the system clock. The clock generating means may further be configured to generate the first clock edges in response to the pulse using an edge detection means. The clock generating means may comprise holding means for receiving and holding the output of the edge detection means to the value to which the first clock edges transition in response to the pulse generated by the pulse generation means. The holding means may further be for holding a value of the internal clock until receipt of a reset signal.

The memory means may further comprise self-time means for generating the reset signal, which may be a pulse. Read and write operations of the memory may be triggered at the first edges. Reset events of the memory may be timed according to the self-timing circuitry. The reset events may be at least one of a sense amplifier enabler, a bit line pre-charge on, word line off, and a clock generator reset. The edge detector means may further comprise enable input means for receiving an enable signal. The memory may be a synchronous self-timed memory.

According to a fourth aspect, there may be provided a method comprising receiving a system clock at a memory; and generating, by the memory, first clock edges of an internal memory clock in response to a rising and a falling edge of the system clock.

The generating step may comprise generating a pulse in response to edges of the system clock; generating the first clock edges in response to the pulses; and holding a value to which the first edges transition until receipt of a reset signal.

The memory may be a self-timed memory and the reset signal which may be a pulse is generated by self-timing circuitry of the memory. The method may further comprise performing read and write operations in response to the first edges. The method may further comprise timing reset events of the memory in response to the self-timing circuitry. The reset events may be at least one of a sense amplifier enabler, a bit line pre-charge on, word line off, and a clock generator reset. The method may further comprise enabling the clock generation in response to a received an enable signal.

DETAILED DESCRIPTION

Embodiments may provide a dual clock edge triggered memory. In other words embodiments may provide a memory that operates on both a rising and a falling edge of a clock. In some embodiments the memory may form part of a system where the components of the system are clocked by a system clock and are operable on both a rising and a falling edge of a system clock.

In some embodiments the memory may have internal components that are clocked by a derived clock signal internal to the memory. This internal clock may be generated from a system clock received at the memory. The memory components may be operable on a single clock edge, for example a rising edge or a falling edge of the internal clock. In some embodiments the internal clock may be generated at double the frequency of the system clock. The internal clock may provide an operable edge (either a rising edge or a falling edge) in response to a rising edge and a falling edge of the system clock.

In this manner, in some embodiments, the internal components of the memory may remain triggered by a single clock edge of the internal clock, while the memory operates at both a rising and a falling edge of the system clock.

The system clock may be delivered to the memory via a clock tree. Similarly the system clock may be delivered to the elements of the system via the clock tree. In some embodiments, the system may be provided on an integrated circuit. The integrated circuit may comprise other sequential elements such as flip-flops which may also be dual edge triggered.

Embodiments may provide a memory comprising a clock edge detector. The clock edge detector may detect a rising edge and a falling edge of the system clock. The clock edge detector may generate an internal clock for the operation of internal memory components. The operable clock edge of the internal clock may correspond to a rising and falling edge of the system clock signal.

In some embodiments a clock edge detector of a memory may be modified to generate an internal clock signal in response to both the rising and falling edge of a system clock. The other components of the memory may remain unchanged. In some embodiments a cycle time of the memory may be a minimum required time between a rising and falling edge or falling and rising edge of clock. This may take into account the dual edge operation of the memory. It will be appreciated that for a component clocked by a single edge, a cycle time may be a minimum required time between a rising and next rising or a falling and next falling edge of clock.

Figure 1:
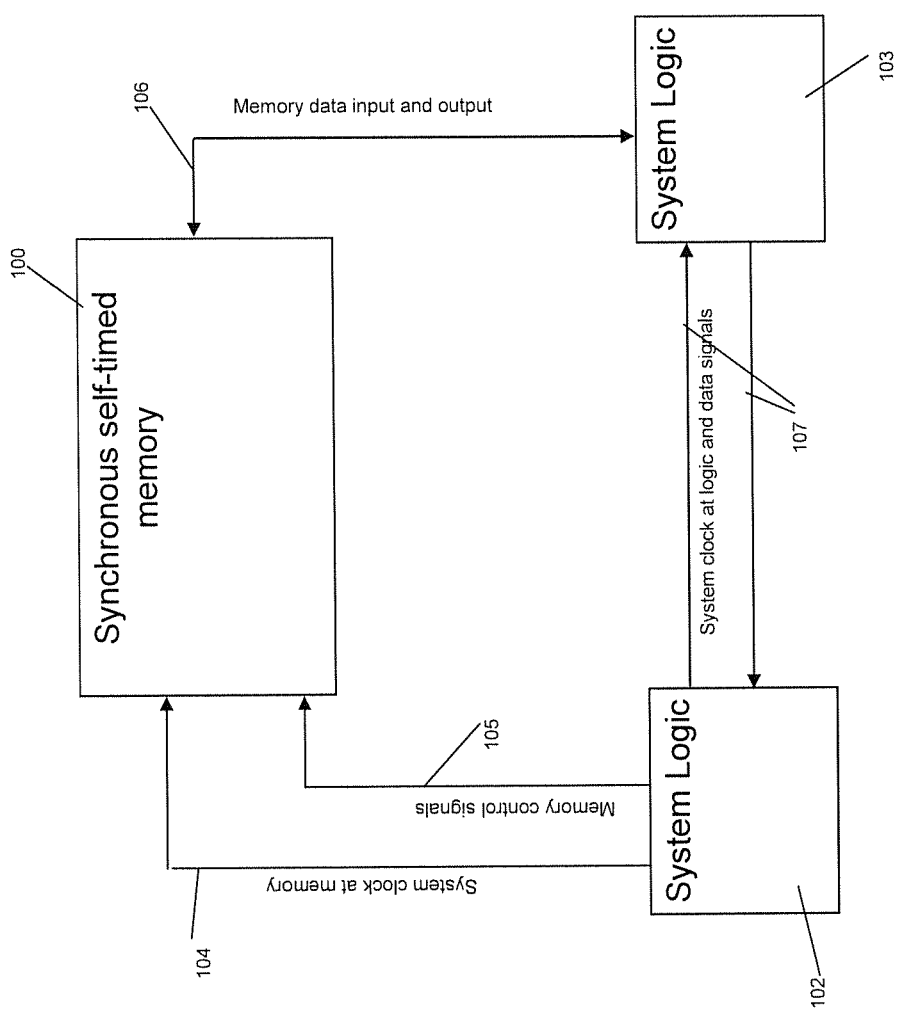
FIG. 1 shows a system containing a memory according to some embodiments.

FIG. 1 shows an example of a system in which embodiments may be implemented. FIG. 1 shows a synchronous self-timed memory 100. A self-timed memory may be one in which read and write operations of the memory are triggered at an operable clock edge but reset events are timed according to internal self-timing circuitry. The reset events may be, for example, a sense amplifier enable, a bit line pre-charge on, word line off, or a clock generator reset etc.

FIG. 1 further comprises system logic 102 and 103. The memory 100 and system logic 102 and 103 may interact through signals 104, 105, 106 and 107. The system logic 102 and 103 may, for example, comprise of a plurality of flip-flops and/or combinational logic. The self-timed memory 100 may receive memory control signals 105 and a system clock 104 from the system logic 102. System logic 102 and system logic 103 may interact via the system clock and data signals 107. The self-timed memory 100 may provide a memory output 106 to the system logic 103.

The self-timed memory 100, system logic 102 and system logic 103 may be synchronous. In other words these components may be triggered at a clock edge and operate synchronously at that clock edge. A system clock may be provided to all the synchronous components of the system. In some embodiments clock distribution may be carried out using standard clock tree approaches.

The system clock may be buffered before being input to the synchronous components. The insertion of the system clock buffers may delay the system clock. Clock signals 104 and 107 may be buffered clock signals and may be delayed by a different amounts from a parent clock. In some embodiments the parent clock may be derived from a phase locked loop (PLL).

The buffered system clocks 104 and 107 may trigger the operation of respective components accordingly. The self-timed memory 100 may be dual clock edge triggered. In some embodiments the system logic 102 and 103 may also be dual clock edge triggered. In other words, these components may operate on both a rising edge and a falling edge of the system clock.

It will be appreciated that the system of FIG. 1 is by way of example only and the synchronous self-timed memory 100 may be implemented in a variety of systems according to other embodiments.

Figure 2:
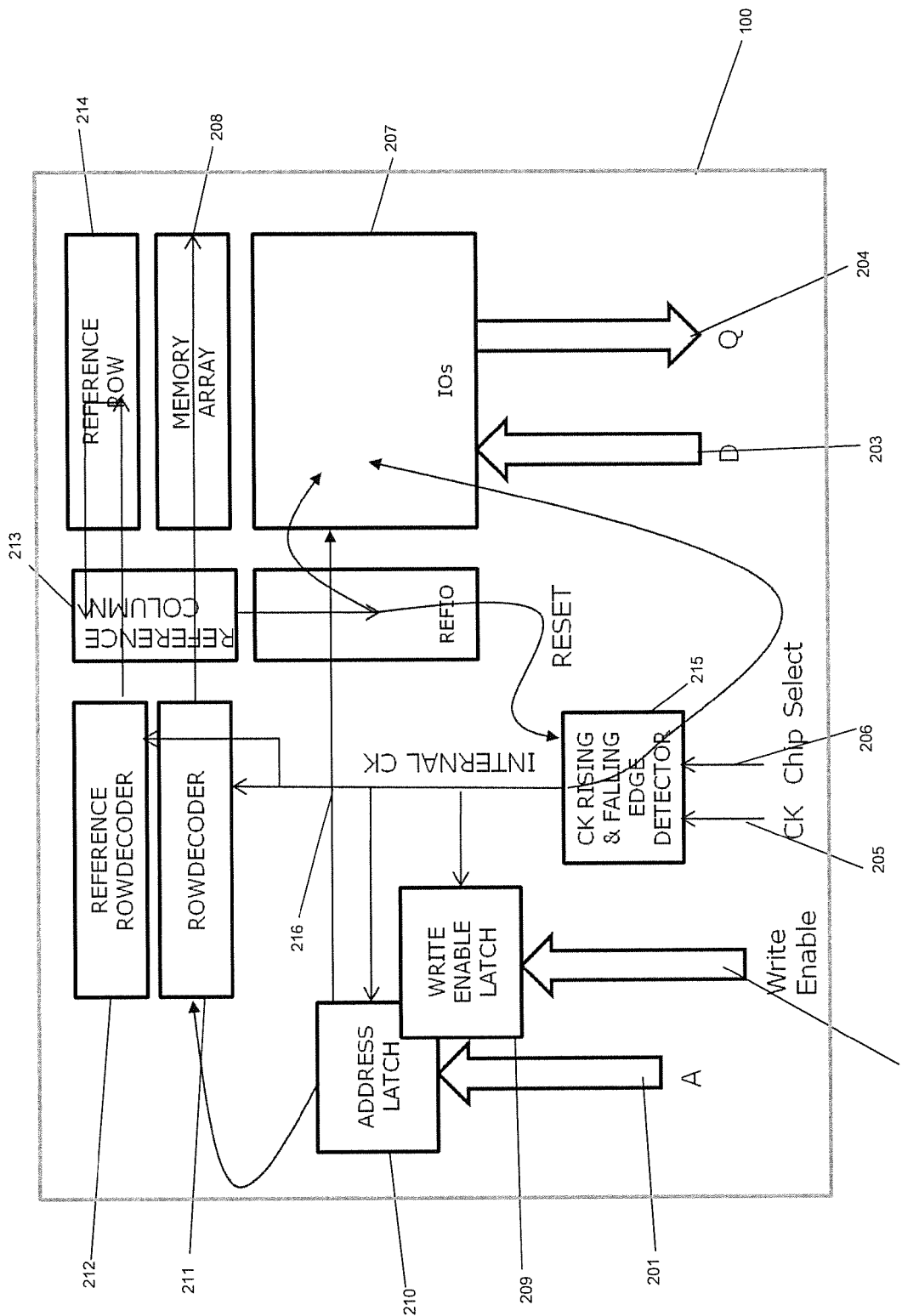
FIG. 2 shows a synchronous self-timed memory according to some embodiments.

FIG. 2 shows an example of the synchronous self-timed memory 100.

Memory 100 of FIG. 2 receives memory control signals such as an address signal 201, a write enable signal 202 and a chip select signal 206. In some embodiments these signals may be received over the signal line 105 from the system logic 102 in FIG. 1. The memory 100 also receives a data signal 203 and outputs a data read from the memory 204. In some embodiments the data signal 203 and output 204 may be coupled to a system data bus 106.

The memory 100 may also receive timing signals such as the clock signal 205. In some embodiments the clock signal 205 may be received from the system clock signal at memory 204. The system clock 104 may be delivered by a clock tree.

The data written to the memory 204 and read from the memory 204 may be input and output through an input/output interface 207. The input/output interface 207 may be coupled to a memory array 208 which may include memory cells for storing data. The input/output interface 207 may include write drivers, sense amplifiers, column multiplexers, and pre-charge circuitry for writing and reading from the memory array 208.

The chip select signal 206 may be used at the internal clock generator to indicate whether a valid (read or write) operation is to take place. The write enable signal 202 may be input into a write enable latch 209 which may indicate whether a read or write operation is to take place. The address 201 may be input into an address latch 210 which may indicate an address to/from which a write/read operation is to take place. The address latch 210 may be coupled to a row decoder 211 and input/output 207. The memory internal clock may be coupled to a row decoder 211, reference row decoder 212, reference column 213 and input/output interface 207. The memory 100 may further comprise a reference row block 214.

The write enable latch 209 and address latch 210 may provide an indication of a type of operation and an address of the operation respectively. The row decoder 211 may provide signals corresponding to a row of the memory cells of the memory array 208 that have been addressed. Similarly, the column address bits of the address bits latched in the address latch 210 may provide signals for selection of an addressed column of the memory cells of the memory array 208. The memory 100 may also comprise self-time circuitry, in turn composed of the reference row decoder 212 and reference column 213, for controlling the reset operations of the memory. The reference row decoder 212 and reference column 213 may be enabled by the memory internal clock, irrespective of the address location, and may generate the self-timing reset for the memory, which may be a pulse. The above set of signals may also control sense amplifiers, write drivers and pre-charge circuitry in order to perform the memory operation.

The components of the memory 100 may be clocked by an internal clock signal 216. The internal clock signal may be generated by a clock edge detector 215 of the memory. The clock edge detector 215 may receive the clock signal 205 and the chip select signal 206 and may generate an internal clock for use by the internal components of the memory. For example the address latch 210, write enable latch 209, decoders 211, 212, 213, 214 may all be clocked by the internal clock signal generated by the clock edge detector.

It will be appreciated that the memory architecture of FIG. 2 is by way of example only and embodiments may be implemented using different architectures. In some embodiments the clock edge detector may be provided to allow the memory to operate on both the rising and the falling edge of the system clock 204. In other words, a clock edge detector 215 may be provided for the memory 100 to be a dual clock edge triggered.

In embodiments the clock edge detector may provide a dual edge clocking of the memory. The clock edge detector may generate an internal clock signal in response to a rising and a falling edge of the system clock. The internal clock signal may be used to clock an operation of the memory 100.

In some embodiments, the clock edge generator may generate an internal clock signal in response to a clock edge. The internal clock signal may indicate to the components of the memory that a read/write operation determined by the received signals 202 will take place. Other clocking circuitry may be included for the self-timed operations of the memory.

The clock edge detector may detect a clock edge of the system clock and generate an operable clock edge of the internal clock in response to each detected edge. An operable clock edge may be an edge on which the components of the memory 100 are triggered. In some embodiments the internal components of the memory that receive the internal clock may be single clock edge triggered and the clock edge detector may generate an internal clock signal having an operational edge corresponding to a rising and a falling edge of the system clock.

In some embodiments, the internal clock may clock the read/write operation on the memory 100 while reset events of the memory are timed according to self-timed circuitry of the memory 100.

Figure 3:
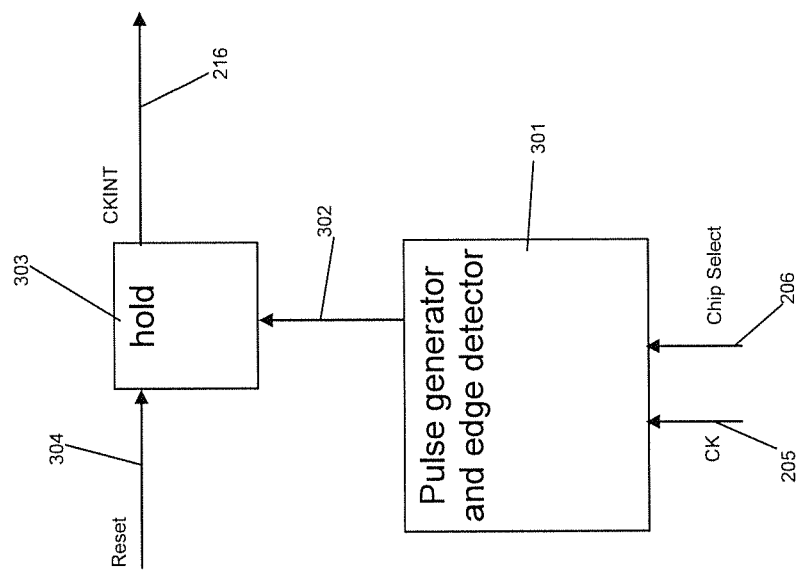
FIG. 3 shows a clock edge detector according to some embodiments.

FIG. 3 shows an example of the clock edge detector 215.

The clock edge detector 215 may receive a clock signal 205 and a chip select signal 206 at a pulse generator 301. The pulse generator 301 may generate a pulse in response to the detection of an edge of the clock signal 205. The pulse generated may drive the signal 302 to a voltage level corresponding to operable internal clock edge, and may be transmitted to a hold circuit 303. The hold circuit 303 may hold the signal 302 and internal clock signal 216 until a reset signal 304, which may be a pulse, is received.

For example, in one embodiment, the hold circuit 303 may hold the internal clock signal 216 low, and signal 302 to corresponding value, until a reset pulse is received on signal 304. A reset pulse will reset the internal clock signal 216 to a high, and signal 32 to corresponding value, until a new pulse is received from the pulse generator 301, which drives the internal clock signal 216 to low again, and the signal 302 to a corresponding value. It will be appreciated that this is by way of example and the hold circuit 303 may hold the internal clock signal 216 high until a reset to low is received, for the case when internal memory components are triggered by internal clock signal going high.

The reset signal 304 may be a pulse, and may be generated by the internal self-timing circuitry of the memory 100. For example this may ensure that the components of the memory are not re-triggered until a memory cycle is finished. The reset signal 304 may also additionally or alternatively be generated by a system reset for resetting the memory.

Figure 4:
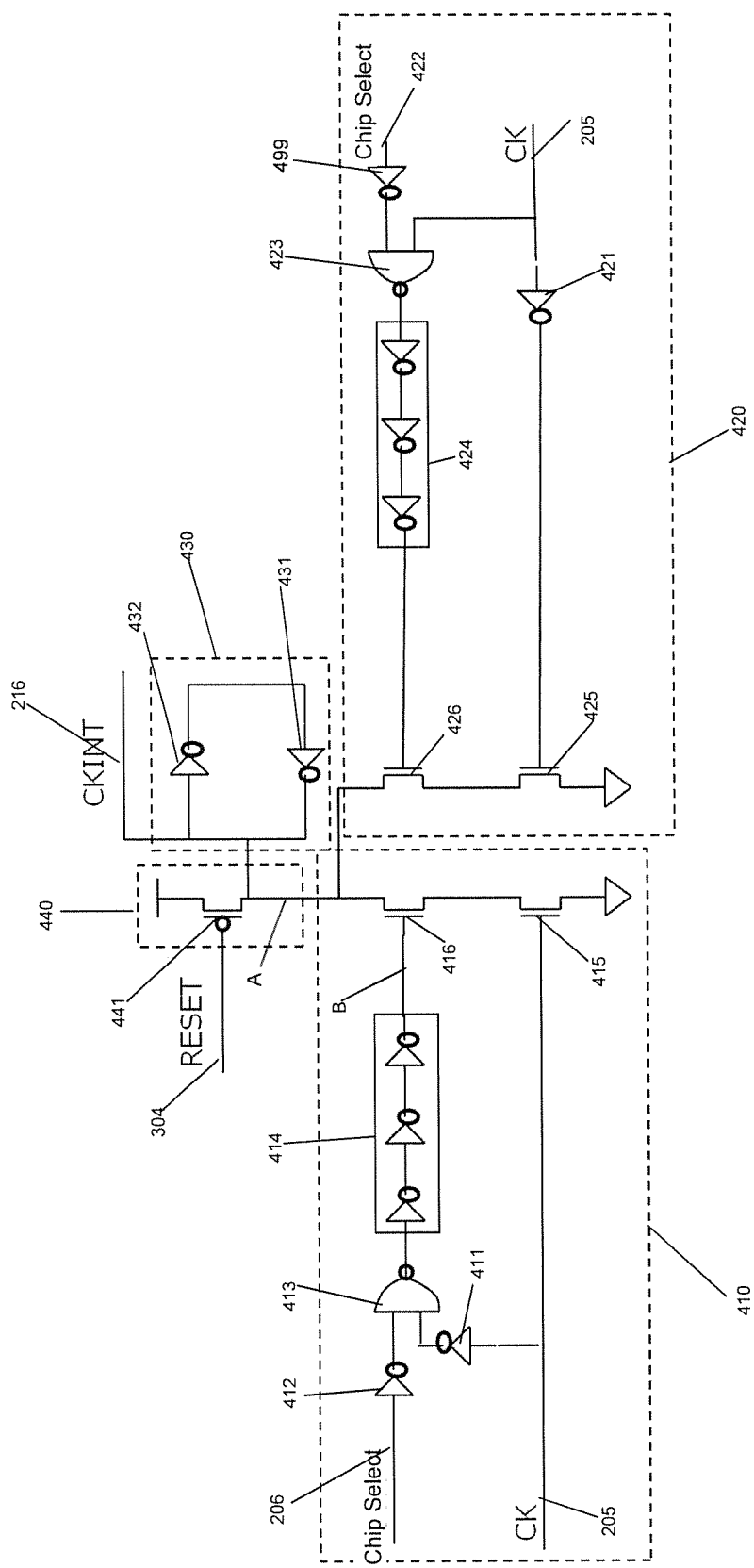
FIG. 4 shows a first embodiment of the circuitry of a dual clock edge detector.

FIG. 4 shows an example implementation of the clock edge detector 215. FIG. 4 comprises a rising edge detection block 410, a falling edge detection block 420, a hold circuit 430 and a reset circuit 440. The hold circuit 430 provides an internal clock signal 216 and the reset circuit 440 receives a reset signal 304. The rising and falling edge detection circuits 410 and 420 receive chip select signals 206/422 and the system clock at memory, 205. In this embodiment, chip select is assumed to be active low (i.e. would enable internal clock generation if the level is logic low at the time of system clock at memory 205 rising or falling edge), and would disable it otherwise. It will be appreciated that this is by way of example only and in some embodiments the chip select signal may be active high.

The rising edge detection circuit 410 detects a rising edge of the clock signal and generates a pulse in response thereto, the pulse in this case defined as the duration between system clock 205 going high and the node B connected to the gate terminal of transistor 416 going low. The falling edge detection circuit 420 detects a falling edge of the clock signal and generates a pulse, the pulse in this case defined as the duration between system clock 205 going low and node connected to the gate terminal of transistor 426 going low. The respective pulses in the rising and falling edge detection circuits drive node A to low, where it is held by the hold circuit 430. Additionally the reset circuit resets the hold circuit 430 by driving the node A to high again, in response to a low going reset pulse received on signal 304.

The rising edge detection circuit comprises a first transistor 415 and a second transistor 416. Clock signal 205 is input into the gate of the transistor 415. The source of transistor 415 is coupled to ground with the drain of transistor 415 being coupled to the source of transistor 416. In the rising edge circuit 410, the signal chip select 206/422 is input into a first NOT gate 412. The clock signal 205 is input into a second NOT gate 411. The outputs of the first and second NOT gates 411 and 412 are input into a NAND gate 413. The output of the NAND gate 413 is input into an inverting delay circuit 414.

In some embodiments, the inverting delay circuit 414 comprises three NOT gates however it will be appreciated that the delay circuit may comprise more or less NOT gates depending on a desired delay corresponding to the time desired for the transistor 416 to stay on for being able to pull down node A. The same delay may also be generated by any other delay introducing mechanisms other than a logic delay. The output of inverting delay circuit 414 is input into the gate of the transistor 416. The drain of the transistor 416 is coupled at node A to the hold circuit 430 and the reset circuit 440.

The falling edge detection circuit also receives the clock signal 205 and the chip select signal 206/422. Clock signal 205 is input into the gate of a third transistor 425 via a NOT gate 421. The source of transistor 425 is coupled to ground and a drain of transistor 425 is coupled to the source of a fourth transistor 426. The clock signal 205 is also input into a first input of a NAND gate 423. The second input of the NAND gate 423 coupled to chip select 422 via a NOT gate 499.

The output of the NAND gate 423 is input into an inverting delay circuit 424. Similar to the rising edge detection circuit the delay circuit comprises three NOT gates however it will be appreciated that the delay circuit may comprise more or less NOT gates depending on a desired delay of the time desired for the transistor 416 to stay on for being able to pull down node A. The same delay may also be generated by any other delay introducing mechanisms other than a logic delay. The output of the delay circuit 424 is input to the gate of the fourth transistor 426. The drain of the transistor 426 is coupled to the hold circuit 430 and the reset circuit 440 via node A.

The reset circuit 440 comprises a fifth transistor 441. The transistor 441 receives at its gate the reset signal 304, which may be a low going pulse. A drain of transistor 441 is coupled to the hold circuit 430 via the node A. The source of the transistor 441 is coupled to a voltage source.

The hold circuit 430 comprises a first NOT gate 432 with its input coupled to the drain of the transistor 441. The output of the first NOT gate is input into a second NOT gate 431. The output of the second NOT gate 431 is coupled to the drain of transistor 441. In this manner the hold circuit will hold a value of node A that is overridden with the second value.

The shared drain of p-channel MOSFET device 441 n-channel MOSFET device 416 and n-channel MOSFET device 426, which is also the input of the first NOT gate 432, provide the internal clock output signal 216.

In the embodiment of FIG. 4 the first 415, second 416, third 425 and fourth 426 transistors are n-channel MOSFETS and the fifth transistor 441 is a p-channel MOSFET however it will be appreciated that with modifications to the circuitry the channel type of the transistor may be changed.

The operation of the circuit of FIG. 4 will be discussed in relation to the signal diagrams of FIG. 5.

Figure 5:
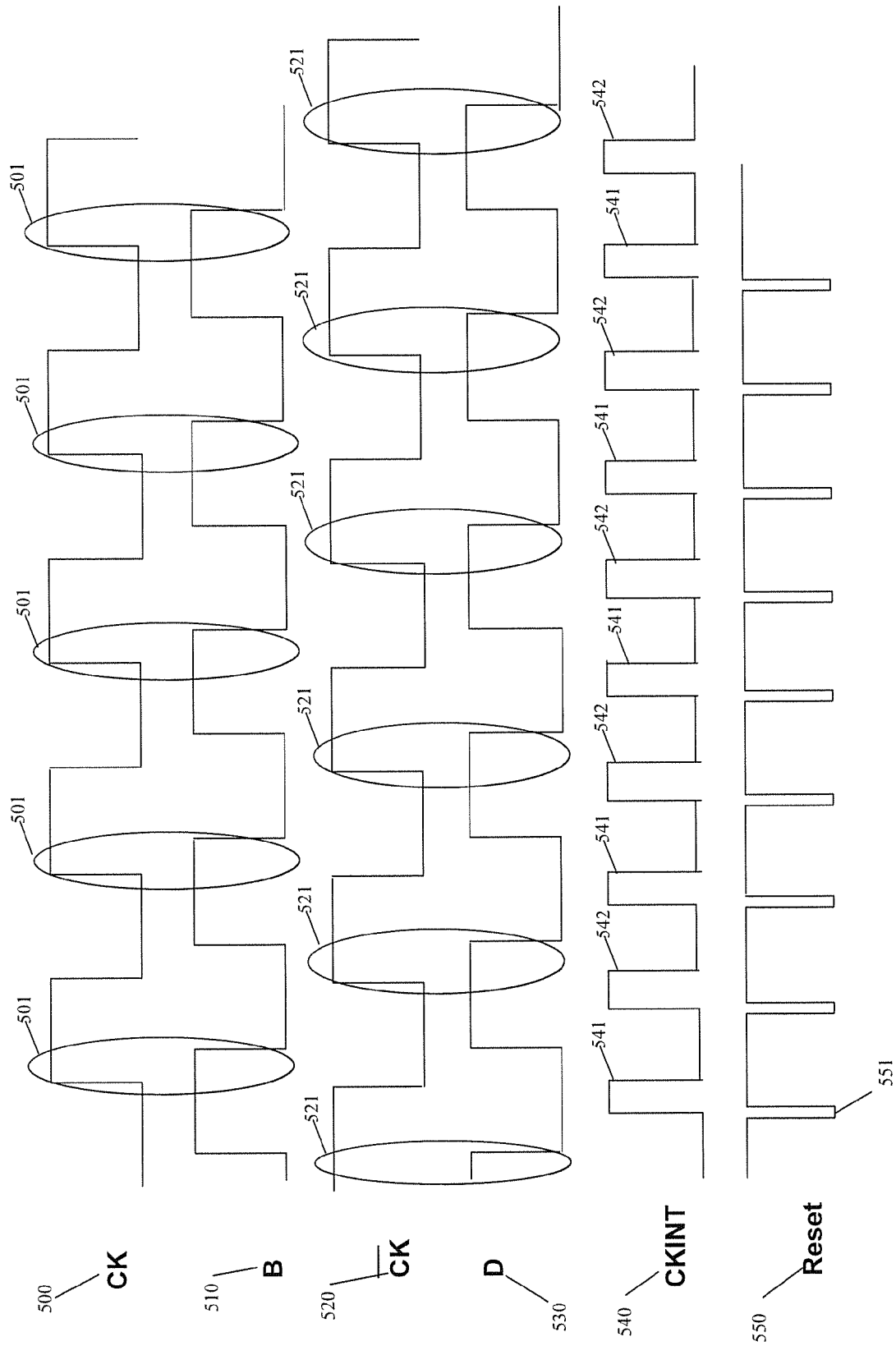
FIG. 5 shows a signal diagram of the first embodiment.

FIG. 5 shows clock 500 which may correspond to the system clock at memory 204. Node B 510 shows a signal at the gate of the second transistor 416. The inverted clock signal 520 shows the signal present at the gate of the third transistor 425. Node D shows the signals present at the gate of the fourth transistor 426. A clock internal CKINT 540 shows the signals at the output of the internal clock 216. Reset 550 shows the signals at the reset signal input 304.

In operation, when the reset signal 550 is not asserted, the fifth transistor 441 is off. Node A is then free to be pulled down in response to a detected pulse.

The operation of the rising edge detection circuit 410 will be discussed first. The clock signal 500 is input to the gate of the first transistor 415. When the clock input 500 goes high, the first transistor 415 turns on and pulls its drain to ground. The clock input 500 may also be inverted and input to the NAND gate 413. When both the clock input 500 and the chip select input 206 are low, the NAND gate 413 receives two high signals as input. The NAND gate 413 may only output a low when both inputs are high. The low output from the NAND gate 413 may be input into the inverting delay circuit 414 where it is delayed and inverted and a resulting high may be input to the gate of the second transistor 416.

Node B shows the signal at the gate input of the second transistor 416. From this point it can be seen that the second transistor 416 will turn on a delayed time after both the clock 500 and chip select signals 206 go low. The delay may correspond to the delay of the NOT gates 411 or 412, NAND gate 413 and delay circuit 414. The signal at node B may behave as a delayed inverted clock signal, when chip select is low.

When the clock signal 500 and the signal at node B 510 are both high, both the transistors 415 and 416 will be on and node A will be pulled to ground. FIG. 5 shows the overlap 501 and when the clock signal 500 and the signal at node B 510 are both high and the transistors 415 and 416 are on. In this case, node A is pulled low and a low signal is input to the input of the first NOT gate 432 of the hold circuit. The NOT gate 432 inverts the input and a high is output into the input of the second NOT gate 431. The second NOT gate inverts this and outputs a low to node A. In this manner the signal at node A and the internal clock output is held low even when transistors 415 and 416 turn off. This can be seen by the CKINT 540 remaining low until a reset signal is received. In this embodiment, Node B, i.e. gate of transistor 416 will go low after a short delay from the rising edge of clock 500, after which node A is held to low by the hold circuit, until the reset signal 550 goes low, triggered by memory internal self-timing. The reset signal 550 is a low going pulse, and eventually goes high.

The falling edge detector circuit 420 works similarly to the rising edge detector circuit 410, except the clock signal is not inverted on the input to the NAND gate 423 but is inverted on the input to the first transistor 425.

In the falling edge detector 420 the clock signal is input to the NOT gate 421 and so the signal at the gate of the first transistor 415 is equivalent to an inverted clock signal. It will be appreciated that this inverted clock signal experiences a slight delay due to the NOT gate 421. The transistor 415 is therefore on when the clock signal is low and the inverted clock signal 520 is high. Clock signal 205 is also input into the NAND gate 423 along with the inverted chip select signal. Similar to the NAND gate 413 the output of the NAND gate is only low when both of the inputs are high. The output of the NAND gate 423 is delayed by the inverting delay circuit 424 and inverted. The signal at node D 530 is therefore equivalent to a delayed clock signal. This is shown in the plot of D 530. The fourth transistor 426 is on when the signal at node D is high and the third transistor 425 is on. FIG. 5 shows the overlap 521 when the signal at node D and the inverted clock signal are high. In other words the time for which the first transistor 425 and the second transistor 426 will be on.

When both transistors are on, node A is pulled low. The hold circuit 430 works similarly to that described with relation to the rising edge detection circuit and will hold the low value even once the transistors 425 and 426 are no longer on.

It will be appreciated that due to the NOT gate 421, there is a slight delay with relation to the internal clock signal being pulled low when there is a falling edge of the clock. However this delay is negligible because the only delay introduced in the path is the single NOT gate.

The internal clock signal may be reset when a memory cycle has finished. In other words once the self-timed mechanism within the memory generates the end of cycle event, the reset signal can be pulled low in order to reset node A so that the internal clock signal can go high and be prepared to go low again in response to the next detected edge of the clock. After it has reset node A, the reset signal goes high.

When the reset signal is pulled low, the transistor 441 turns on and connects node A to the voltage source. Node A goes high and pulls the internal clock signal 216 high. The hold circuit 430 behaves similarly as described with respect to the rising edge and the falling edge detection and holds node A high, even once the reset signal has been de-asserted and the transistor 441 is no longer on.

The internal clock signal including pulses 541 and 542 has been plotted at 540 and the reset signal at 550. As can be seen from 540, the internal clock signal goes low when an edge is detected on the rising edge of the clock as shown by 501 and also with the falling edge of the clock as shown by 521. In these cases the internal clock signal has a falling edge whenever the system clock has an edge.

The reset signal pulse 550 may be asserted for a period after the internal clock signal has gone high. This may correspond to a memory cycle and may be the time at which the internal clock circuitry has finished carrying out a memory operation. The reset 550 may pull the internal clock signal 540 high again so that the internal clock signal may indicate a next detected edge by going low.

Figure 6:
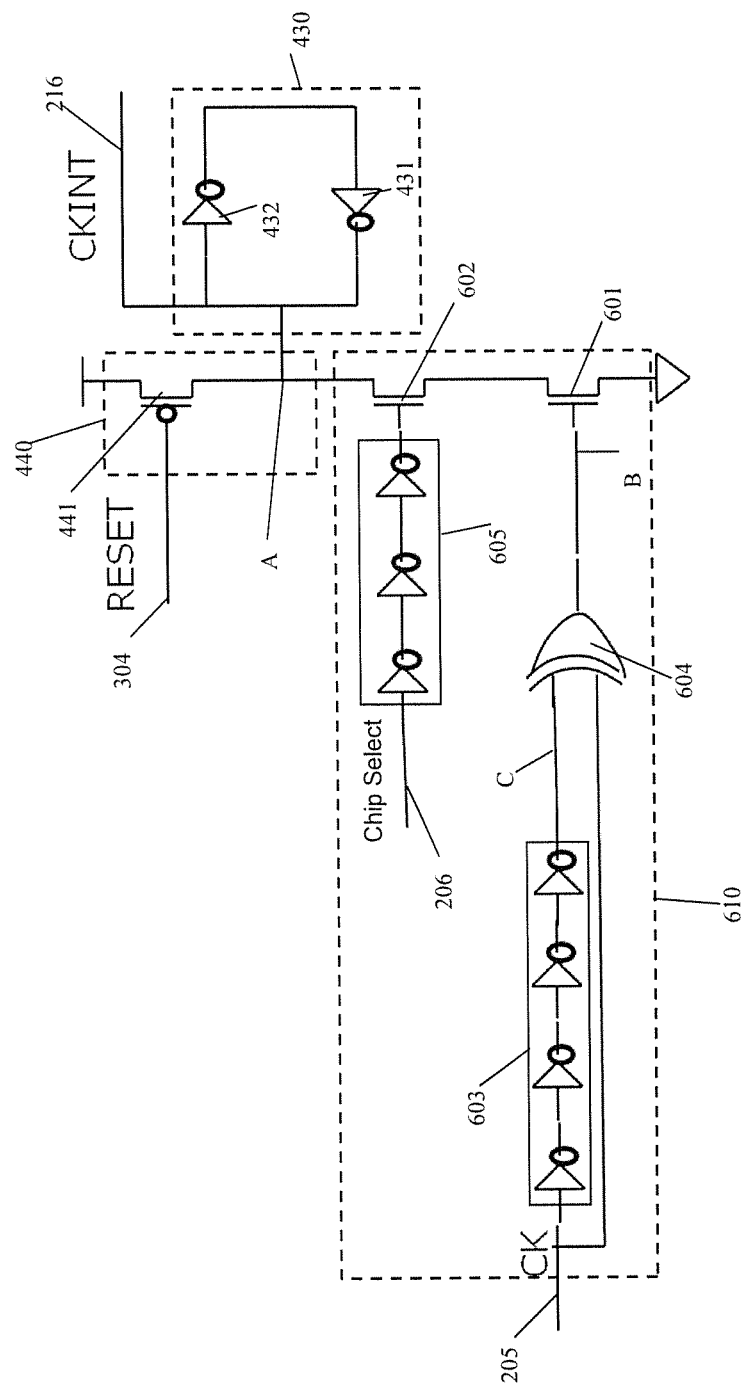
FIG. 6 shows a second embodiment of the circuitry of a clock edge detector.

FIG. 6 shows a second embodiment implementation of a dual clock edge detector. FIG. 6 comprises an edge detection circuit 610, reset circuit 440 and hold circuit 430. The reset circuit 440 and hold circuit 430 may be similar to the reset 440 and hold 430 circuits of FIG. 4 and operate accordingly.

The edge detection circuit 610 of FIG. 6 may comprise a first n-channel MOSFET transistor 601 having a source coupled to ground and a drain coupled to a source of a second n-channel MOSFET transistor 602. The drain of the second transistor 602 may be coupled to a drain of a third p-channel MOSFET transistor 441. The third transistor 441 may form part of the reset circuit 440. The third transistor 441 has a source coupled to a voltage source and a gate coupled to a reset signal 304.

The drain of the third transistor 441 and the drain of the second transistor 602 are coupled to an input of a first NOT gate 432. An output of the first NOT gate 432 is coupled to the input of a second NOT gate 431. The output to the second NOT gate 431 is coupled to the drains of the second and third transistors. The input of the first NOT gate 432 and the drain of the second and third transistors forms an internal clock signal output 216. The first and second NOT gates 432 and 431 may form part of the hold circuit 430.

A gate of the second transistor 602 is coupled to a chip select signal 206 via an inverting delay circuit 605. Thus this is for chip select being active low. The delay circuit may comprise three NOT gates. It will be appreciated that similarly to the embodiments of FIGS. 4 and 5, the delay circuit may be designed to provide various delays, or through mechanisms for delay other than logic delay. The delay circuit 605 may be configured to tune the hold time of chip select signal with respect to the system clock at memory edge. The gate of the first transistor 601 is coupled to the output of an XOR gate 604. The inputs of the XOR gate 604 are clock signal 205 and a delayed clock signal C. The delayed clock signal may be delayed by delay circuit 603 comprising four series coupled NOT gates. It will be appreciated that four series coupled NOT gates are by way of example only and the length of the delay may be altered by for example having varying numbers of NOT gates or the delay may be introduced by other delay-introducing circuits other than logic gate delays.

In some embodiments, the delay circuit 603, XOR gate 604, first and second transistors 601 and 602 and delay circuit 605 may form part of the edge detection circuit 610. It will also be appreciated that while the transistors have been depicted as n or p-channel MOSFETs, the channel type or transistor type may be changed with minor or no modifications to the circuit.

The operation of circuit 610 of FIG. 6 will now be described with relation to FIG. 7.

Figure 7:
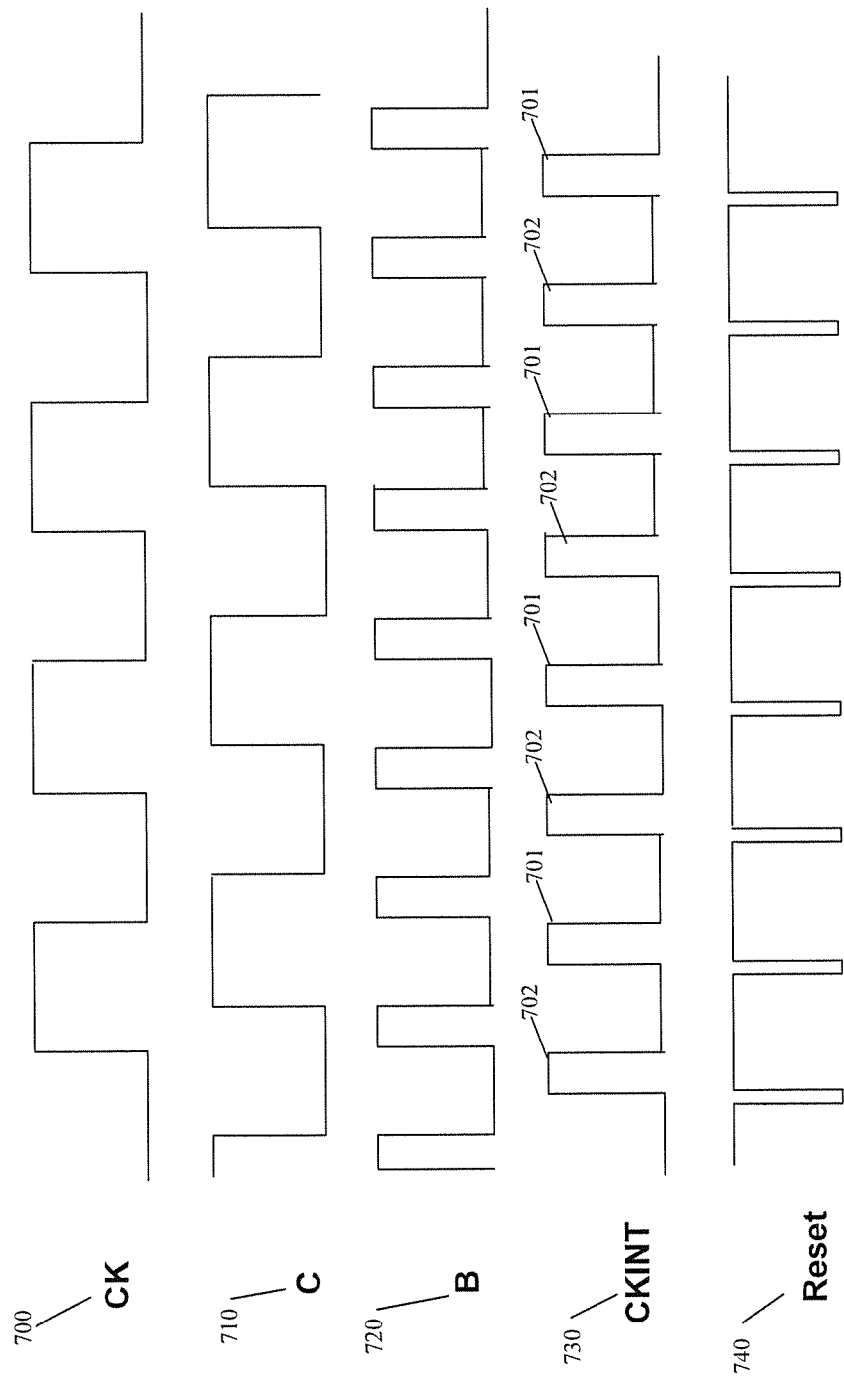
FIG. 7 shows a signal diagram of the second embodiment.

FIG. 7 shows the clock signal 700 on the clock signal line 205. FIG. 7 shows the signal at node C which is the delayed clock input into the XOR gate 604. The signal at node B which is the gate of the first transistor 601 is also shown. FIG. 7 also shows the internal clock signal 730 on the internal clock output 216 and the reset signal 740 on the reset line 304.

The clock signal 700 is input into the XOR gate 604 along with the delayed clock signal as shown by 710. The output of the XOR gate 601 is shown by the signal at node B 720 and is high when the inputs to the XOR gate 601 differ.

Area 701 of the signal at node B 720 indicates the time for which the signal at node B 720 is high due to the clock signal 700 being high and the delayed clock signal 710 being low, in order to generate the internal clock at rising edge of system clock at memory. Area 702 of the signal at node B 720 indicates the time for which the signal at node B 720 is high due to the clock signal 700 being low and the delayed clock signal 710 being high, in order to generate the internal clock at falling edge of system clock at memory.

As can be seen from FIG. 7, the clock signal 700 and delayed clock signal 710 differ at the rising edge of the clock and at the falling edge of the clock. The node B 720 goes high at the rising edge of the clock signal 700 and at the falling edge of the clock signal 700. The gate of the first transistor 601 received the signal at node B 720 and the transistor 601 may pull the source of the transistor 602 low corresponding to when B 720 is high.

The second transistor 602 receives a delayed and inverted chip select signal at its gate. The second transistor 602 is on when chip select 206 is low and the first and second transistor 601 and 602 pull node A low. This corresponds to chip select being active low. It would be appreciated that the chip select being an active low is by way of example only. For example, a simple modification of the delay chain 605 in FIG. 6, to convert it to a non-inverting delay chain would convert this circuit to work with chip select being active high.

The hold circuit 430 and reset circuit 440 of FIG. 6 work similarly to the hold and reset circuits of FIG. 4. The signal 730 at the internal clock output 216 is held low until the reset signal 740 at input 304 is asserted. The internal clock signal 730 may go low corresponding to a rising clock edge and a falling clock edge and be reset to high by the reset signal 740 between the clock edges. The reset signal may be a low going pulse generated by memory internal self-timing circuitry.

In the embodiment of FIGS. 6 and 7 the XOR gate 604 may introduce a delay in the clock signal 711 path. The transistors 601 and 602 may pull node A low at this delay after a rising or falling clock edge. In some embodiments, the XOR gate 604 may introduce a delay corresponding to two gate delays, based on how the XOR gate is realized. This may be a negligible delay in the operation of the memory. In some embodiments, the design of the pulse generation circuit 301 may be such that a minimal delay is introduced into the clock path for dual edge detection.

Figure 8:
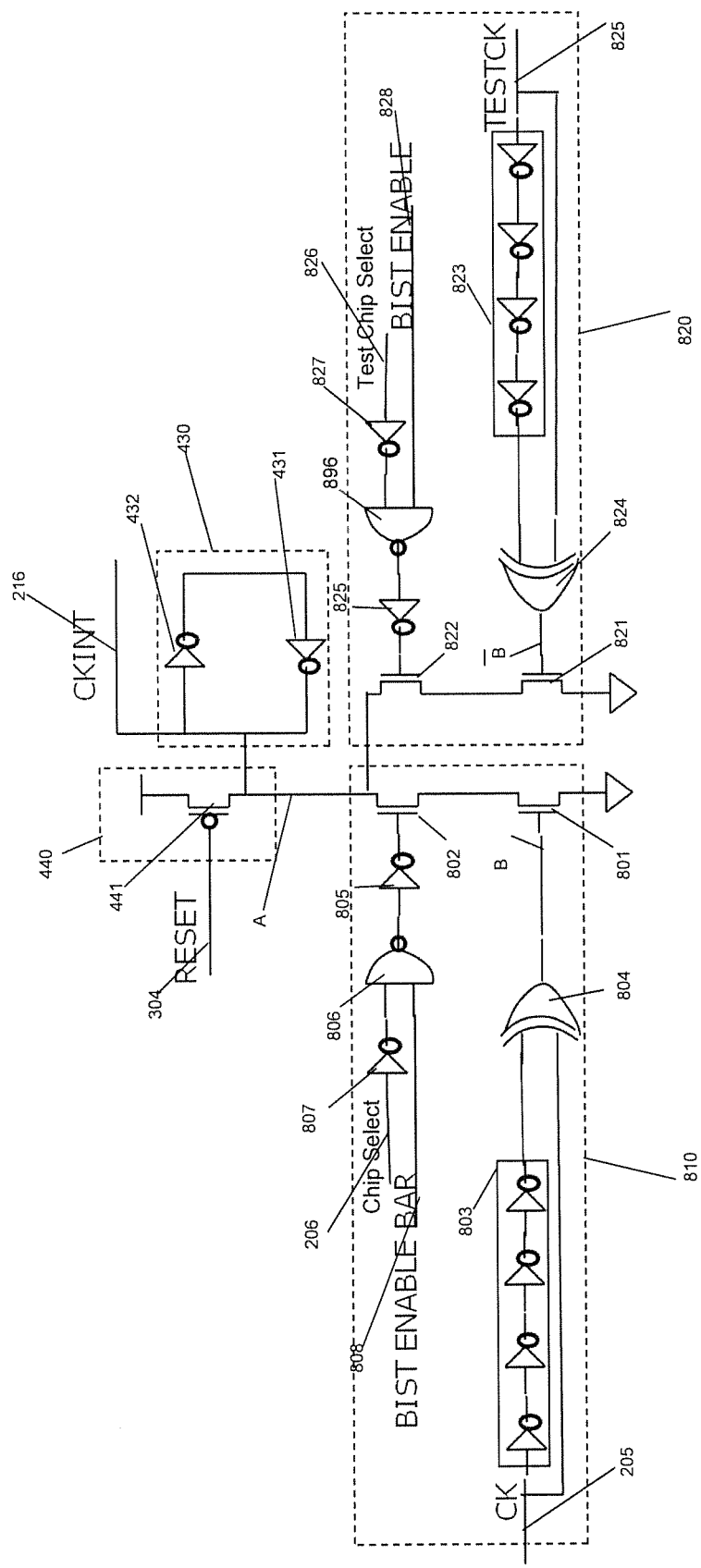
FIG. 8 shows a third embodiment of the circuitry of a clock edge detector.

FIG. 8 shows an embodiment of the invention that is implemented in conjunction with a built-in self-test or BIST mechanism. The circuit of FIG. 8 has two independent system clocks at memory. One clock, CK 205, is the normal functional clock which has been previously discussed in relation to various embodiments. The second clock, TESTCK 825, may be a test clock. The test clock 825 may be invoked by the built-in self-test BIST, during memory testing. Further, there are two chip select signals, one corresponding to enable the memory in functional mode (i.e. chip select 206), and another is to enable the memory during test mode (i.e. test chip select 826). The test chip select signal 826 may be controlled by the memory BIST. Only one of the signals will control the generation of internal clock, depending on the value of BIST enable 828 and corresponding BIST enable bar 808. When BIST enable 828 is asserted (set to logic high), this may signify a test mode by BIST and control of internal clock generation by test chip select 826. When BIST enable 828 is deasserted (set to logic low), this may signify normal functional mode and control of internal clock generation by chip select.

FIG. 8 has a reset circuit 440, hold circuit 430, edge detection circuit 810 and a BIST edge detection circuit 820. It will be appreciated that the reset circuit 440 and hold circuit 430 may be similar to the reset circuit 440 and hold circuit 430 of previously described embodiments and may operate similarly.

The edge detection circuit 810 may be similar to the edge detection circuit 610 of FIG. 6 with the exception of the circuitry between the chip select signal input 206 and the second transistor 802. In the embodiments of FIG. 8, the chip select signal 206 is input into a NOT gate 807. The output of the NOT gate 807 and an inverted BIST enable input 808 may be input to an NAND gate 806. The output of the NAND gate 806 may be input into a NOT gate 805 and the output of the NOT gate 805 may form the gate input of the second transistor 802.

The circuit of FIG. 8 may also comprise a BIST edge detection circuit 820. The BIST edge detection circuit 820 may comprise a delay circuit 823, XOR gate 324, first transistor 821, NOT gate 827, NAND gate 896, NOT gate 825 and second transistor 822.

It will be appreciated that the BIST edge detection circuit 820 may comprise similar circuitry to the edge detection circuit 810 with the exception of a test clock input 825 instead of a clock input 205, a test chip select input 826 instead of a chip select input 206, and a BIST enable signal 828 instead of a BIST enable bar 808. The inverted BIST enable 808 may be the inverse of the BIST enable.

During normal operation (when the circuit is not in a self-test mode of operation) the BIST enable signal may be pulled low and the inverted BIST enable is pulled high. A low chip select signal 206 is inverted into the input of the NAND gate 806 and the output of the NAND gate 806 is low. The output of the NAND gate 806 is inverted by the NOT gate 805 and the gate of the second transistor 802 of the edge detection circuit 810 is high. The drain of the second transistor 802 may be pulled low when the first transistor 801 is on. The low BIST enable signal input on one of the inputs to the NAND gate 896 causes the NAND gate 896 to output a high independent of the value of the test chip select signal 826. Thus the second transistor 822 of the BIST edge detection circuit is off.

The edge detection circuit 810 may operate similarly to the edge detection circuitry 610 when the BIST enable 828 is low. When the BIST enable is low the BIST edge detection circuit 820 may be disabled from pulling the input to the hold circuit 430 low.

During a self-test mode, the BIST enable signal 828 may be pulled high. The inverted BIST enable signal may go low disabling the edge detection circuit 810 from pulling the input of the hold circuit low in a similar manner to the disabling of the BIST edge detection circuit. The high BIST enable signal may cause the second transistor 822 of the BIST edge detection circuit 820 to turn on with a low test chip select signal 826 in a similar manner to the operation of the edge detection circuit 810.

In this mode of operation, the TESTCK signal 825 may turn the first transistor 821 of the BIST edge detection circuit on similarly to the operation of the edge detection circuit 810 when the BIST enable signal is low.

In some embodiments, the BIST enable signal may be asserted and a test clock 825 and test chip select 826 signal may be provided to the circuit for a self-test operation. The test clock 825, test chip select 826 and BIST enable signal may, in some embodiments, be provided to the circuitry via a suitable test interface.

Embodiments may allow minimum modification to a memory to modify the memory to operate on both clock edges of a system clock. In some embodiments, internal memory components may still operate on a single clock edge. The generation of an internal clock for the internal memory components may be modified to provide a rising or falling edge in response to both a rising edge and a falling edge of a system clock. An internal clock generator of a memory may be modified to achieve this.

A self-timed memory may have a memory cycle time for carrying out a memory operation between two operation clock edges. For example, a memory that operates on a rising edge may have the minimum required period between one rising edge and the next to carry out a memory cycle. In embodiments, the memory cycle time may be the minimum time between two valid clock edges (i.e. clock edges with chip select enabled), including both rising and falling clock edges, as the memory is operational on both a rising edge and a falling edge. In some embodiments, the set up and hold times of the signals within the memory are also interpreted as defined with respect to both rising and falling edge of clock, in order to carry out a memory cycle within a rising and falling edge.

Embodiments may provide modification to the internal clock generator that provide a dual edge detection with a minimal timing and dynamic power penalty. For example in some embodiments a single inverter is included in the clock path. In other embodiments the clock path may include an XOR gate. Embodiments may provide a single clock tree for the synchronous components of a system. In some embodiments a dual triggered memory clock generator may improve dynamic power compared to externally implementing the same logic, as external implementation involves extra dynamic power in the logic required to reset the system clock at memory, and may also toggle much higher capacitance due to clock signal routing, corresponding to the two clock edges per operation required to be asserted at the memory input. An improvement in power, performance and area penalty may occur in the embodiments, as the extra logic required to reset the system clock at memory is not needed in the embodiments, and the memories are converted to dual edge triggered memories in a custom way allowing improved design.

Although in the foregoing description circuitry has been described through use of logic gates such as for example AND, NAND, NOT, XAND gates, it will be appreciated that these gates may be implemented by any suitable circuitry for carrying out the operation of the circuit. It will further be appreciated that other circuitry may be implemented to carry out similar functionality with minor modification. For example n-channel transistors may be replaced by p-channel transistors or signals with inverted signals with minor modifications to the circuitry. Equivalent circuitry may also be provided to carry out the functionality of embodiments. It will be appreciated that such circuitry is by way of example only.

The invention claimed is:

1. Memory circuitry comprising:
   memory components operable in response to first edges of an internal clock; and
   internal clock generating circuitry configured to generate the internal clock in response to a system clock, wherein the first edges of the internal clock are generated in response to both a rising and a falling edge of the system clock, and wherein the internal clock generating circuitry receives a reset signal.

2. The memory circuitry of claim 1 wherein the first edges are one of rising edges and falling edges.

3. The memory circuitry of claim 1 wherein the internal clock generating circuitry comprises:
   a pulse generation circuit configured to generate a pulse in response to an edge of the system clock.

4. The memory circuitry of claim 3 wherein the internal clock generating circuit comprises an edge detection circuit to generate the first edges in response to the pulse.

5. The memory circuitry of claim 4 wherein the internal clock generating circuitry further comprises:
   a hold circuit configured to receive the first edges from the edge detection circuit and hold a value to which the first edges transitions in response to the pulse.

6. The memory circuitry of claim 5 wherein the hold circuit is configured to hold a value of the internal clock until receipt of the reset signal.

7. The memory circuitry of claim 6 further comprising:
   self-time circuitry, the self-time circuitry being configured to generate the reset signal.

8. The memory circuitry of claim 3 wherein the edge detection circuit further comprises:
   an enable input configured to receive an enable signal.

9. The memory circuitry of claim 1 wherein read and write operations of the memory components are triggered at the first edges.

10. The memory circuitry of claim 1 wherein reset events of the memory components are timed according to self-timing circuitry.

11. The memory circuitry of claim 10 wherein the reset events are at least one of sense amplifier enable, bit line pre-charge on, word line off and clock generator reset.

12. The memory circuitry of claim 1 wherein the memory components are configured for synchronous self-timed memory functions.

13. A system comprising:
    at least one dual edge triggered synchronous component;
    memory circuit coupled to the at least one dual edge triggered synchronous component and comprising:
    memory components operable in response to first edges of an internal clock; and
    internal clock generating circuitry configured to generate the internal clock in response to a system clock, wherein the first edges of the internal clock are generated in response to both a rising and a falling edge of the system clock, and wherein the internal clock generating circuitry receives a reset signal.

14. The system of claim 13 wherein the at least one dual edge triggered synchronous comprises a flip-flop.

15. The system of claim 13 wherein the at least one edge triggered synchronous component comprises at least one combinational logic component.

16. A memory device comprising:
    functional means for carrying out a memory function in response to first edges of an internal clock; and
    clock generating means for generating the internal clock in response to a system clock, wherein the first edges of the internal clock are generated in response to both a rising and a falling edge of the system clock, and wherein the clock generating means receives a reset signal pulse.

17. The memory device of claim 16 wherein the clock generating means comprises:
    pulse generating means for generating a pulse in response to an edge of the system clock.

18. The memory device of claim 17 wherein the clock generating means further comprises an edge detection circuit to generate the first clock edges in response to the pulse.

19. The memory device of claim 18 wherein the clock generating means comprises:
    holding means for receiving the first clock edges from the edge detection means and holding a value to which the first edges transition in response to the pulse.

20. The memory device of claim 19 wherein the holding means is further for holding a value of the internal clock until receipt of the reset signal pulse.

21. The memory device of claim 20 further comprising:
    self-time means for generating the reset signal pulse.

22. The memory device of claim 18 wherein the edge detector circuit further comprises:
    enable input means for receiving an enable signal.

23. The memory device of claim 16 wherein read and write operations are triggered at the first edges of the internal clock.

24. The memory device of claim 16 wherein reset events are timed according to a self-timing circuitry.

25. The memory device of claim 24 wherein the reset events are at least one of sense amplifier enable, bit line pre-charge on, word line off and clock generator means reset.

26. The memory device of claim 16 wherein the functional means and clock generating means are configured for synchronous self-timed memory operations.

* * * * *

UNITED STATES PATENT AND TRADEMARK OFFICE
CERTIFICATE OF CORRECTION

| | | |
|---|---|---|
| PATENT NO. | : 8,913,457 B2 | Page 1 of 1 |
| APPLICATION NO. | : 14/271165 | |
| DATED | : December 16, 2014 | |
| INVENTOR(S) | : Kohli et al. | |

It is certified that error appears in the above-identified patent and that said Letters Patent is hereby corrected as shown below:

In the Claims

Column 14, Line 15, Claim 14      Delete: "synchronous comprises"
                                  Insert: --synchronous component comprises--

Signed and Sealed this
Eleventh Day of August, 2015

Michelle K. Lee
*Director of the United States Patent and Trademark Office*